(12) United States Patent
Coillot et al.

(10) Patent No.: US 7,759,933 B2
(45) Date of Patent: Jul. 20, 2010

(54) MAGNETIC AMPLIFICATION DEVICE COMPRISING A MAGNETIC SENSOR WITH LONGITUDINAL SENSITIVITY

(75) Inventors: Christophe Coillot, Paris (FR); Paul Leroy, Bourg la Reine (FR); Gérard Chanteur, Antony (FR); Alain Roux, Palaiseau (FR); Frédéric Nguyen Van Dau, Palaiseau (FR)

(73) Assignees: Thales (FR); Centre National de la Recherche Scientifique (FR)

( * ) Notice: Subject to any disclaimer, the term of this patent is extended or adjusted under 35 U.S.C. 154(b) by 166 days.

(21) Appl. No.: 12/016,938

(22) Filed: Jan. 18, 2008

(65) Prior Publication Data
US 2008/0174308 A1 Jul. 24, 2008

(30) Foreign Application Priority Data
Jan. 19, 2007 (FR) .................................. 07 00376

(51) Int. Cl.
*G01R 33/12* (2006.01)
(52) U.S. Cl. .................. 324/252; 324/117 R; 338/32 R
(58) Field of Classification Search ................ 324/252, 324/117 R; 338/32 R
See application file for complete search history.

(56) References Cited

U.S. PATENT DOCUMENTS

| | | | |
|---|---|---|---|
| 4,185,265 A | 1/1980 | Griffen et al. | |
| 5,483,161 A | 1/1996 | Deeter et al. | |
| 5,686,879 A | 11/1997 | Schuhl et al. | |
| 6,191,581 B1 | 2/2001 | Van Dau et al. | |
| 6,496,004 B1 | 12/2002 | Nguyen Van Dau et al. | |
| 7,094,480 B2 | 8/2006 | Nguyen Van Dau et al. | |
| 7,259,437 B2 | 8/2007 | Nguyen Van Dau et al. | |
| 2004/0047110 A1 | 3/2004 | Friederich et al. | |
| 2004/0196744 A1 | 10/2004 | Nguyen Van Dau et al. | |
| 2005/0111530 A1 | 5/2005 | Chen et al. | |

FOREIGN PATENT DOCUMENTS

| CH | 683469 A5 | 3/1994 |
|---|---|---|
| EP | 0772042 A2 | 5/1997 |
| JP | 02087086 | 3/1990 |

OTHER PUBLICATIONS

Leroy, Paul et al. "Optimisation of the Shape of Magnetic Filed Concentrators to Improve the Sensitivity of Hall Sensors." Proceedings of the SSD, 05 Congress in 2005, pp. 1-8.
U.S. Appl. No. 11/722,692, filed Jun. 22, 2007, Paul Leroy et al. (Not Yet Published).

*Primary Examiner*—Reena Aurora
(74) *Attorney, Agent, or Firm*—Lowe Hauptman Ham & Berner, LLP

(57) ABSTRACT

The invention relates to a magnetic amplification device comprising a magnetic sensor with longitudinal sensitivity, having a first piece of magnetic material and a second piece of magnetic material, each of the pieces having a longitudinal slot at its center, the pieces being separated by a distance called the gap, and the magnetic sensor being inserted into the two slots. The device of the invention typically makes it possible to measure low magnetic fields smaller than the Earth's field using a magnetic sensor of the AMR type.

20 Claims, 4 Drawing Sheets

MAGNETIC AMPLIFICATION DEVICE COMPRISING A MAGNETIC SENSOR WITH LONGITUDINAL SENSITIVITY

RELATED APPLICATIONS

The present application is based on, and claims priority from, French Application Number 07 00376, filed Jan. 19, 2007, the disclosure of which is hereby incorporated by reference herein in its entirety.

FIELD OF THE INVENTION

The field of the invention is that of magnetic sensors and especially magnetoresistive sensors used for measuring low fields, that is to say equal to or smaller than the Earth's magnetic field.

BACKGROUND OF THE INVENTION

In general, a magnetoresistive sensor uses the magnetoresistance of ferromagnetic materials, that is to say the variation in the electrical resistance of a conductor under the effect of the magnetic field applied thereto. In practice, this type of sensor requires the application of an excitation current. The output voltage obtained depends on the excitation current and on the magnetoresistance and makes it possible to read out the value of the applied magnetic field. Depending on the sensors, this measurement is a normal measurement, that is to say in a direction orthogonal to the direction of the current, or a transverse measurement, that is to say in the plane of the sensor (collinear or perpendicular to the direction of the current).

The criteria employed for comparing the performance of various types of sensor may typically be: the smallest magnetic field measurable at a given frequency (typically 1 Hz), the mass, the bandwidth, the dimensions of the sensors and their consumption, when they are connected to electronics for conditioning the signal. The preference for these criteria differs according to the application. For CETP (Centre for Terrestrial and Planetary Environmental Studies), which relate to the magnetic component of waves in space plasmas, it is envisaged producing sensors that are sensitive to magnetic fields with a sensitivity of the order of 100 pT/$\sqrt{Hz}$ at 1 Hz and have a low mass and a low consumption in order to be on board.

Among the technologies used for producing this type of magnetometer, the following may in particular be listed:

Hall-effect sensors: small size and low consumption, but it may be difficult for their sensitivity to reach 100 nT/$\sqrt{Hz}$;

AMR (anisotropic magnetoresistance) and "AMR derivative" sensors, GMR (giant magnetoresistance) sensors and TMR (tunnel magnetoresistance) sensors: small size and low consumption; their sensitivity may reach 1 nT/$\sqrt{Hz}$ at 1 Hz, TMR sensors representing a promising technology leaving a sensitivity of 10 pT/$\sqrt{Hz}$ at 1 Hz conceivable;

GMI (giant magnetoimpedance) sensors: these have a low consumption; the other characteristics are still poorly understood since these components are the subject of a recent return of interest, although their principle is well known. The possibility of miniaturization and evolution hint at a low-mass potential and sensitivities below 1 nT/$\sqrt{Hz}$;

flux gate sensors (or flux valve sensors): by far the most common, their size determining their sensitivity. For sensors weighing a few tens of grams, a sensitivity of 100 pT/$\sqrt{Hz}$ is achieved. The technology has reached a degree of maturity which leaves no hope of improving their performance;

SQUID sensors: sensors using the Josephson effect; this type of sensor requires a superconducting ring cooled with liquid helium, offering a sensitivity possibly of less than 1 pT/$\sqrt{Hz}$; it is mainly used in medicine. Its mass and its consumption are unacceptably high in many applications; and Search coil sensors (or flux meters): very sensitive (close to 10 fT/$\sqrt{Hz}$ at 1 kHz) and of low consumption, but bulky (cube of 10 cm per side). These sensors rely on the phenomenon of induction and in principle their excellent sensitivity for frequencies above a few Hz rapidly deteriorates when the frequency drops and does not allow slowly variable magnetic fields to be measured (at less than 1 Hz).

At the present time, the requirements in magnetic sensors with a typical precision of 10 pT are solved using flux-gate technologies. However, these technologies are bulky, not integrateable and relatively expensive in terms of energy. This is why alternatives to this type of magnetic sensor are sought.

The sensitivity of certain types of sensor (in particular Hall sensors) has been able to be improved by having magnetic cores at the centre of which the sensor is positioned. The magnetic amplification thus obtained depends on the distance between the two cores, the smaller this distance the higher this amplification. It has thus been demonstrated that the amplification could locally exceed the relative permeability of the magnetic material and reach amplification factors of more than 1000, when the distance between the two cores is of the order of 100 μm. (P. Leroy, C. Coillot, A. Roux and G. Chanteur, "Optimization of the shape of magnetic field concentrators to improve sensitivity of Hall sensors", proceedings of the SSD, 05 Congress in 2005). In the case of Hall-effect sensors, sensitivities of the order of 100 pT/$\sqrt{Hz}$ at 1 Hz may be envisaged. However, this type of amplification is possible for sensors in which the thickness of the "sensitive" region can be reduced substantially (a few tens of microns), something which is more difficult to achieve in the case of AMR, GMR, TMR and GMI sensors, for which the sensitivity to the magnetic field is in the transverse direction. This is because an AMR chip may be likened to a parallelepiped (with dimensions of the order of 2 mm×2 mm×0.1 mm). In this case, the minimum distance between the cores is equal to the width of the chip (2 mm in the aforementioned example) and the magnetic amplification is then low since the distance between the cores is large.

SUMMARY OF THE INVENTION

To solve this problem and provide a device capable of greatly increasing the sensitivity of a magnetoresistive sensor with longitudinal sensitivity of AMR, GMR, etc. type, the present invention proposes to use two magnetic half-cores, the particular shape of which allows the magnetic flux to be concentrated in the sensitive region of the constituent chip of the sensor, causing an amplification of the magnetic field. The chip is placed in a cavity in such a way that its active part is in the magnetic field confinement region, benefiting from the fanning-out of the field lines (i.e. the field lines that leave the gap region and may be likened to flux leakage) between the two ends of the cores.

More precisely, the subject of the invention is a magnetic amplification device comprising a magnetic sensor having longitudinal sensitivity, characterized in that it comprises a first piece of magnetic material and a second piece of magnetic material, each of the pieces having a longitudinal slot in a central region, said pieces being separated by a distance called the gap, and the magnetic sensor being inserted into the two slots.

According to a variant, each piece of magnetic material comprises an upper element of magnetic material and a lower element of magnetic material, said upper and lower elements being separate.

According to a variant, the magnetic materials of the upper and lower elements are identical.

Advantageously, the first and second pieces consist of identical magnetic materials.

According to a variant, the upper and lower elements each form an integral part and the resulting element has a slot at its centre, the magnetic sensor being positioned in said slot.

According to a variant, the gap distance along an axis called the longitudinal axis separating the longitudinal ends of the first and second pieces is approximately equal to the distance along an axis perpendicular to the longitudinal axis separating the upper and lower elements.

According to a variant, with the first and second pieces of magnetic material having a height of magnetic material along the axis perpendicular to the longitudinal axis, this height has a gradient along the longitudinal axis so that the smallest height is in the gap.

According to a variant, the first and second pieces of magnetic material are each in the form of a nail with a flared outer region and a pointed inner region, said pointed region having a slot, the sensor being inserted into the slots of said first and second pieces.

According to a variant, the magnetic sensor has, along a direction orthogonal to the longitudinal direction, an internal part inserted into the two slots and an external part having conducting contacts, the internal part of the sensor having a smaller thickness than the thickness of the external part.

According to a variant, the first and second pieces of magnetic material are made of ferrite.

The subject of the invention is also a current sensor comprising a magnetic amplification device according to the invention in which the first and second pieces consist of a single torroidal magnetic element. Typically, the current to be measured is made to flow in a closed magnetic circuit (for example of torroidal shape). The current then produces a magnetic field:

$$B=\mu_o\mu_r I/(2\pi R)$$

and in the case of a magnetic circuit with a gap (which is the case as soon as a magnetic sensor is positioned for the measurement):

$$B=\mu_o\mu_r I/(2\pi R+\mu_r d),$$

where:
I is the current to be measured (and is the source of the field B);
$\mu_o$ is the vacuum permeability;
$\mu_r$ is the relative permeability of the material;
R is its radius; and
d is the gap distance.

In general, it is beneficial to have "d" as small as possible so as to be capable of measuring the current as accurately as possible (since B will be higher for the same current).

The magnetic field is then measured by the magnetic sensor having a longitudinal sensitivity which is placed inside the slot.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF A PREFERRED EMBODIMENT

In general, the invention relates to a magnetic amplification device for detecting low magnetic fields and having a magnetic sensor with transverse sensitivity, for example of the AMR type. In this case, it may comprise, in a stack of semiconductor layers, at least one doped semiconductor layer capable of conducting electrons, means for applying an electric current, and means for measuring a voltage, the measured voltage V satisfying the following equation:

$$V=KIB,$$

where K is a constant
I is the applied current and
B is the magnetic field present.

Figure 1:
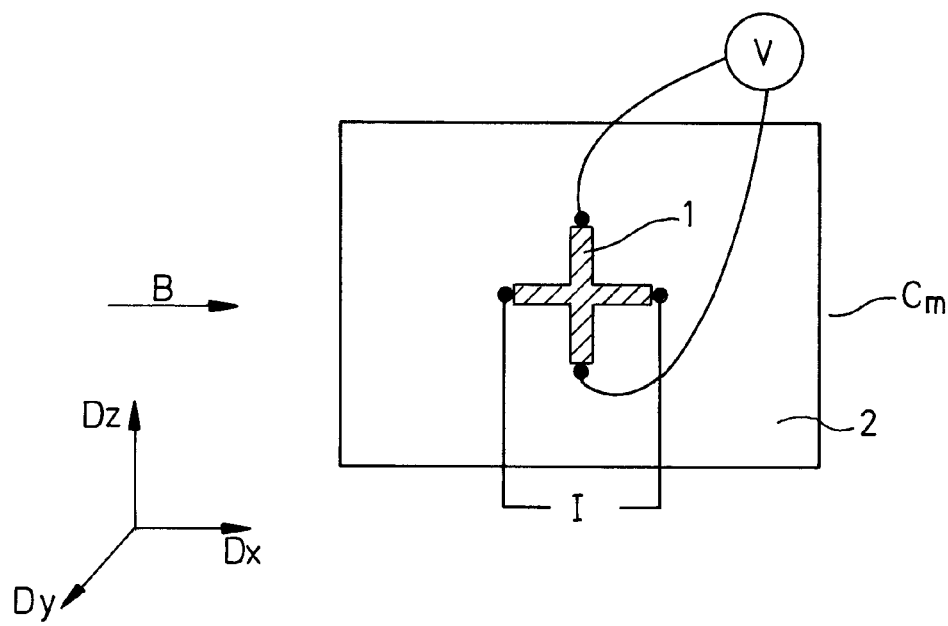
FIG. 1 illustrates a magnetic sensor used in a magnetic amplification device according to the invention.

FIG. 1 illustrates a top view of an example of a magnetic field sensor $C_m$ comprising a doped semiconductor cross 1, the current applied and the measured voltage being along two orthogonal directions Dx and Dz, in order to measure the component of the magnetic field along the direction Dx, called the longitudinal direction. Typically, the doped semiconductor layer of a few microns in thickness may be produced on a semiconductor substrate 2 a few hundred microns in thickness.

Figure 2:
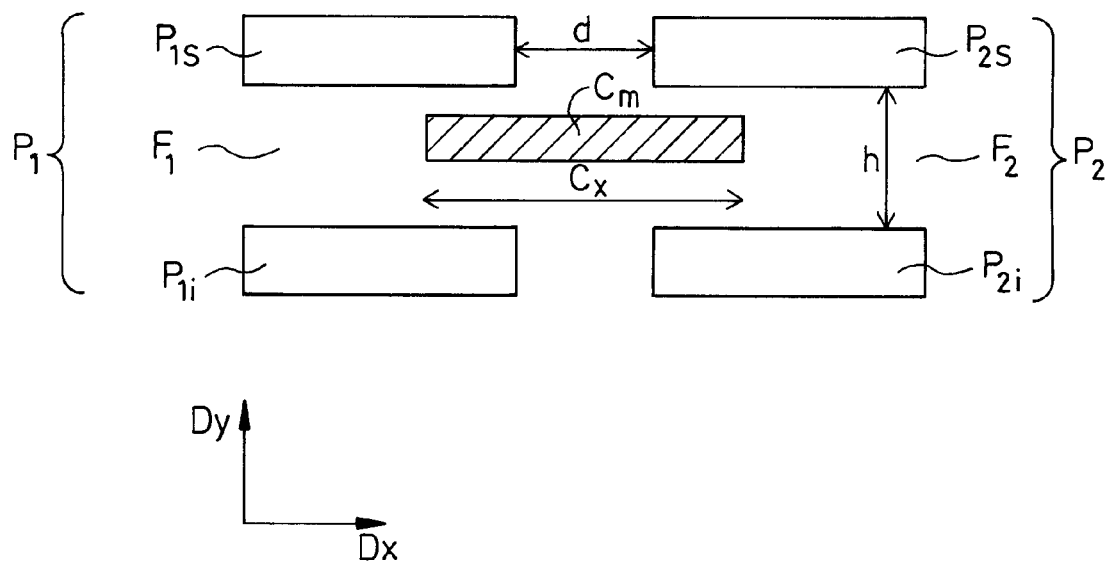
FIG. 2 shows schematically a magnetic amplification device according to the invention.

According to the invention, this type of sensor $C_m$ is positioned between two pieces $P_1$ and $P_2$ of magnetic material, as shown schematically in FIG. 2. Each piece has an upper element and a lower element, said pieces having a slot. Thus, the sensor 1 is positioned between a first piece $P_1$, which itself comprises two elements $P_{1s}$ and $P_{1i}$ and a slot $F_1$, and a second piece $P_2$, which itself comprises two elements $P_{2s}$ and $P_{2i}$ and a slot $F_2$. The pieces of magnetic material are separated by a distance called the gap d along the direction Dx and the slots have a height h along the direction Dy. Advantageously, the longitudinal dimension $C_x$ of the sensor has a non-zero overlap with the pieces of magnetic material, as illustrated in FIG. 2, so as to ensure the best overlap between the magnetic field lines and the magnetic sensor.

Figure 3:
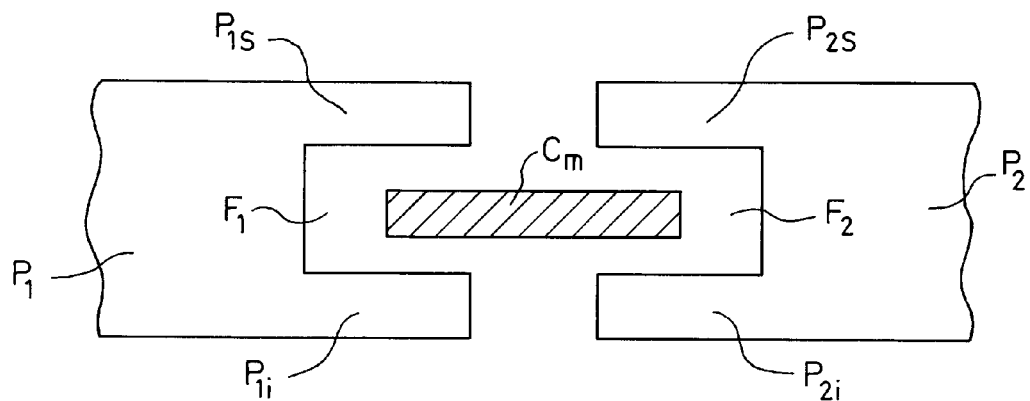
FIG. 3 illustrates a first example of a magnetic amplification device according to the invention.

FIG. 3 illustrates a first example of a magnetic amplification device according to the invention in which the upper and lower elements form an integral part having a slot at their centre. They make it possible to obtain magnetic fields of direction parallel to the direction Dx.

In additional, the magnetic amplification obtained is as high in the slot region as in the gap region whenever the thickness of the slot is equal to the gap distance.

Figure 4A:
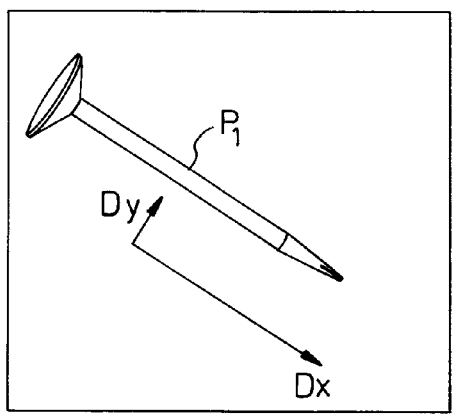
FIGS. 4a and 4b illustrate a second example of a magnetic amplification device of optimized form according to the invention.
Figure 4B:
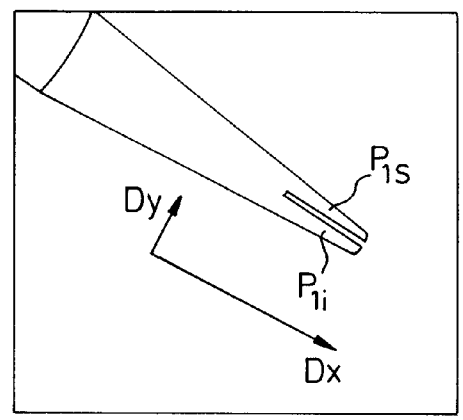

According to a variant of the invention, illustrated in FIGS. 4a and 4b relating to an enlargement of a piece of magnetic material used in a device of the invention, the piece of magnetic material advantageously is in the form of a nail with a flared end for concentrating the magnetic field along the length of said piece, which is still called a core, and likewise the termination in the form of a point allows the magnetic field to be confined in the region where the magnetic field sensor is placed. Thus, the magnetic sensor may be advantageously inserted into the two slots and is advantageously thinned at this point so as to be wider outside said slots along a direction Dz perpendicular to the directions Dx and Dy.

Typically, the dimensions of the magnetic sensor may be of the order of a few millimeters along the directions Dx and Dy, and of tens of microns in thickness along the direction Dz in the thinned active region, possibly reaching a few hundred microns in the external region in which contact pads are produced on the magnetic sensor.

As regards the dimensions of the magnetic pieces or cores, the dimension along the direction Dy may typically be between a few millimeters and a few hundred millimeters. The diameter in the flared part may be of the order of a few millimeters, while the diameter at the centre in the active region may typically be between a tenth of a millimeter and a few millimeters. The thickness of the slots produced in the magnetic cores may advantageously be between about a few tens of microns and a few hundred microns. In this case, the gap is also advantageously between a few tens of microns and a few hundred microns.

Figure 5A:
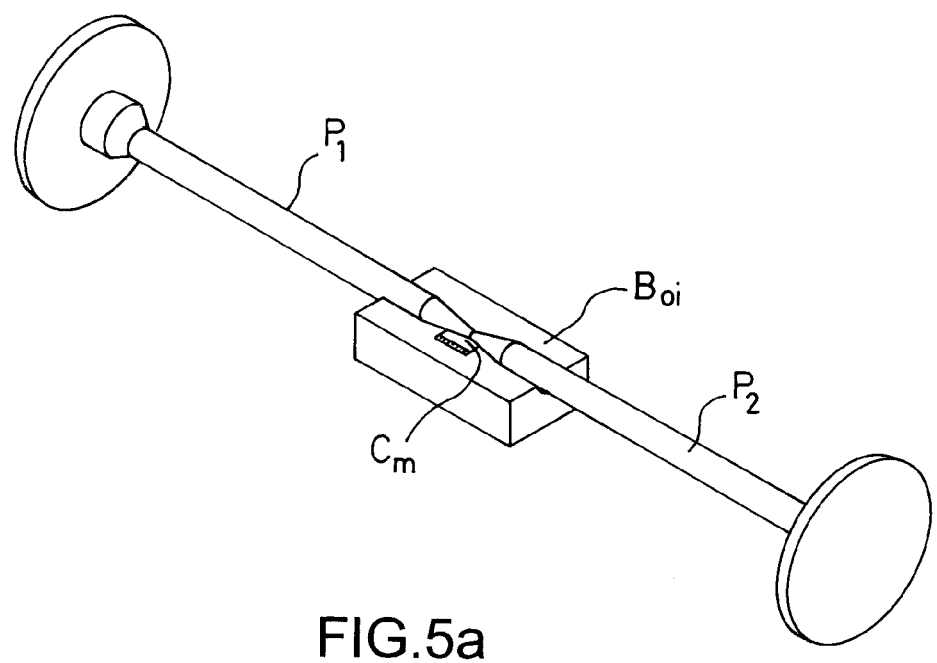
FIGS. 5a, 5b and 5c illustrate an example of structural arrangement allowing the pieces of magnetic material and the magnetic sensor to be fastened.
Figure 5B:
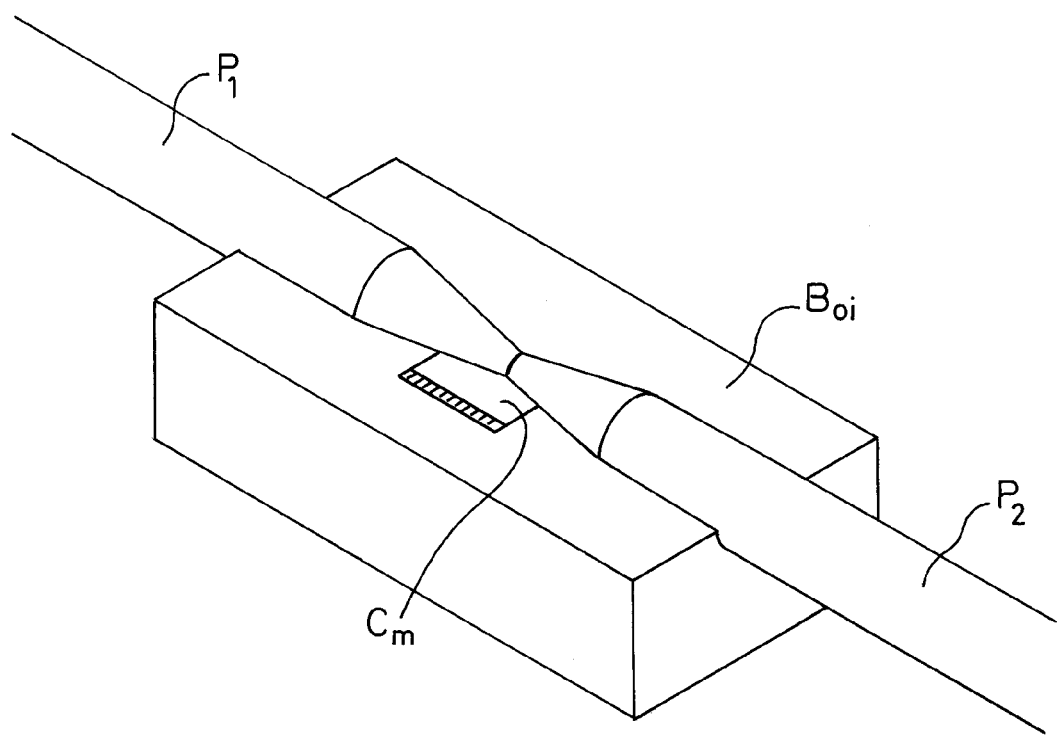
Figure 5C:
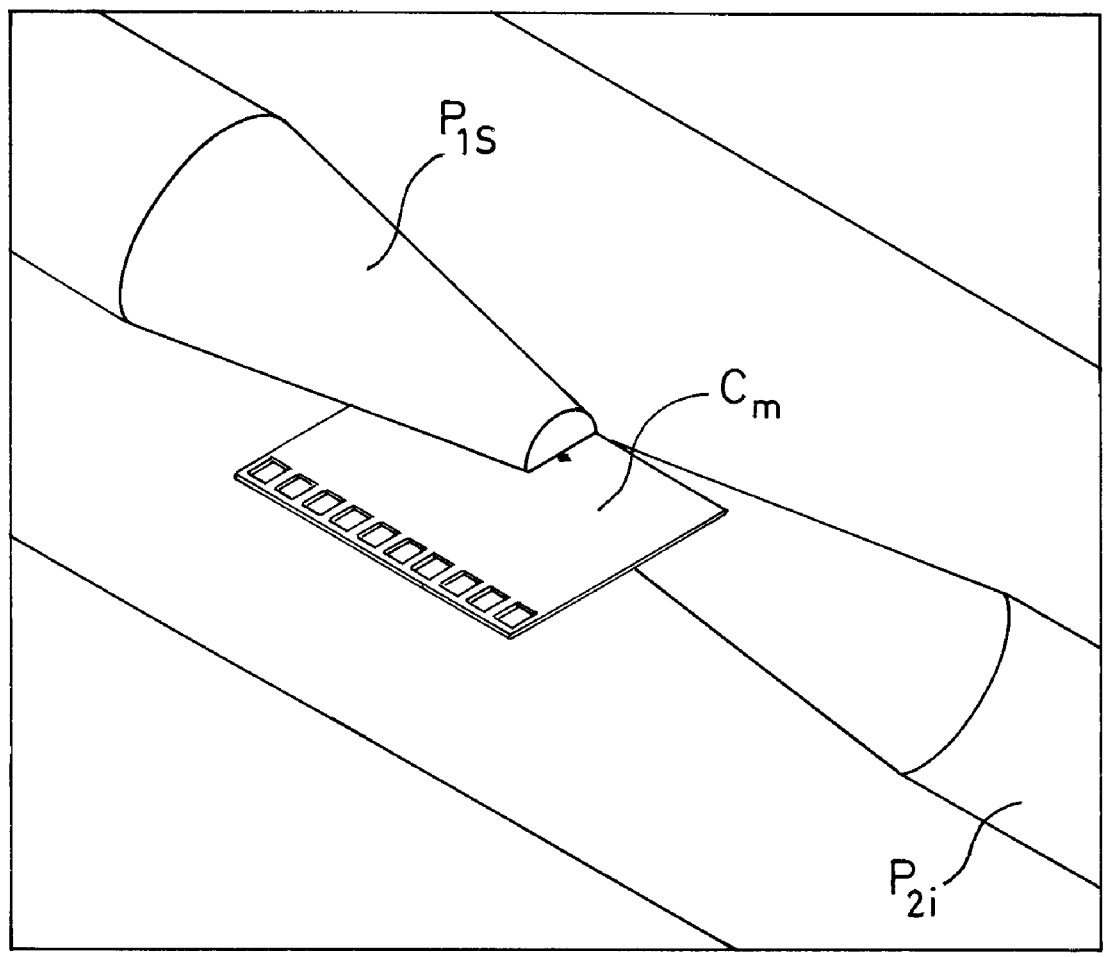

An example of a structure allowing the two magnetic pieces $P_1$ and $P_2$ and the sensor $C_m$ to be fastened is described below. This structure is illustrated in FIGS. 5a, 5b and 5c which show enlarged views of the internal ends of the pieces $P_1$ and $P_2$. The pieces $P_1$ and $P_2$ are typically the pieces as those shown in FIGS. 4a and 4b—their pointed ends are fixed to a module $B_{oi}$. The magnetic sensor is incorporated into the slots of the two pieces and is also fastened to said module. FIG. 5c illustrates in greater detail the upper element $P_{1S}$ of the piece $P_1$ and the lower element $P_{2i}$ of the piece $P_2$, showing the sensor $C_m$ integrated into the slots of the pieces $P_1$ and $P_2$.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A magnetic amplification device comprising:
 a magnetic sensor ($C_m$) of the anisotropic magnetoresistance (AMR), giant magnetoresistance (GMR), tunnel magnetoresistance (TMR) or giant magnetoresistance (GMI) type, the sensitivity to the magnetic field of the device being in the transverse direction, wherein dimensions of the magnetic sensor are of the order of a few millimeters along the directions Dx and Dy and a few hundred microns in thickness; and
 a first longitudinal piece of magnetic material and a second longitudinal piece of magnetic material, each of the pieces of magnetic material having a longitudinal slot in and extending through one end of the longitudinal piece of magnetic material, the one end of the first longitudinal piece being separated from the one end of the second longitudinal piece by a gap of predetermined length;
 wherein the longitudinal slot of the first piece of magnetic material is opposite the longitudinal slot of the second piece of magnetic material and the magnetic sensor is disposed in the gap between the first and second pieces of magnetic material and within the longitudinal slot of the first piece and the longitudinal slot of the second piece.

2. The magnetic amplification device according to claim 1, wherein each piece of magnetic material comprises an upper element of magnetic material and a lower element of magnetic material, said upper and lower elements are separate from each other.

3. The magnetic amplification device according to claim 2, wherein the magnetic materials of the upper and lower elements are identical.

4. The magnetic amplification device according to claim 3, wherein the upper and lower elements each form an integral part having a slot at its center, the magnetic sensor being positioned in said slot.

5. The magnetic amplification device according to claim 2, wherein the upper and lower elements of the first and second magnetic pieces are connected to form an integral part having a slot at its center, the magnetic sensor being positioned in said slot.

6. The magnetic amplification device according to claim 2, wherein the first and second pieces consist of identical magnetic materials.

7. The magnetic amplification device according to claim 2, wherein the predetermined length of the gap is approximately equal to a distance along an axis perpendicular to the longitudinal axis separating the upper and lower elements.

8. The magnetic amplification device according to claim 2, wherein with the first and second pieces of magnetic material having a height of magnetic material along the axis perpendicular to the longitudinal axis, this height has a gradient along the longitudinal axis so that the smallest height is in the gap.

9. The magnetic amplification device according to claim 2, wherein the first and second pieces of magnetic material are each in the form of a nail with a flared outer region and a pointed inner region, said pointed region having a slot, the sensor being inserted into the slots of said first and second pieces.

10. The magnetic amplification device according to claim 2, wherein the magnetic sensor has, along a direction orthogonal to the longitudinal direction, an internal part inserted into the two slots and an external part having conducting contacts, the internal part of the sensor having a smaller thickness than the thickness of the external part.

11. The magnetic amplification device according to claim 2, in which the first and second pieces of magnetic material are made of ferrite.

12. A current sensor comprising a magnetic amplification device according to claim 2, in which the first and second pieces consist of a single closed magnetic element.

13. The magnetic amplification device according to claim 1, wherein the first and second pieces of magnetic material comprise identical magnetic materials.

14. The magnetic amplification device according to claim 1, wherein the predetermined length of the gap is approximately equal to a distance along an axis perpendicular to the longitudinal axis separating the upper and lower elements.

15. The magnetic amplification device according to claim 1, wherein the first and second pieces of magnetic material have a height of magnetic material along an axis perpendicular to the longitudinal axis and the height has a gradient along the longitudinal axis whereby the gap is formed where the height of the first and second pieces of magnetic material is the smallest.

16. The magnetic amplification device according to claim 1, wherein the first and second pieces of magnetic material are each in the form of a nail with a flared outer region and a pointed inner region, said pointed region having a slot, the sensor being inserted into the slots of said first and second pieces.

17. The magnetic amplification device according to claim 1, wherein the magnetic sensor has, along a direction orthogonal to the longitudinal direction, an internal part inserted into the two slots and an external part having conducting contacts, the internal part of the sensor having a smaller thickness than the thickness of the external part.

18. The magnetic amplification device according to claim 1, in which the first and second pieces of magnetic material are made of ferrite.

19. A current sensor comprising a magnetic amplification device according to claim 1, in which the first and second pieces consist of a single closed magnetic element.

20. The current sensor according to claim 19, wherein the single closed magnetic element has a torroidal shape.

* * * * *